(12) United States Patent
Ribton (10) Patent No.: US 12,255,038 B2
(45) Date of Patent: Mar. 18, 2025

(54) ELECTRON GUN CATHODE MOUNT (71) Applicant: TWI Limited, Cambridge (GB)

(72) Inventor: Colin Ribton, Cambridge (GB)

(73) Assignee: TWI Limited, Cambridge (GB)

( * ) Notice: Subject to any disclaimer, the term of this patent is extended or adjusted under 35 U.S.C. 154(b) by 0 days.

(21) Appl. No.: 18/547,556

(22) PCT Filed: Feb. 22, 2022

(86) PCT No.: PCT/GB2022/050478
§ 371 (c)(1),
(2) Date: Aug. 23, 2023

(87) PCT Pub. No.: WO2022/180381
PCT Pub. Date: Sep. 1, 2022

(65) Prior Publication Data
US 2024/0128042 A1    Apr. 18, 2024

(30) Foreign Application Priority Data
Feb. 23, 2021  (GB) ..................................... 2102555

(51) Int. Cl.
*H01J 37/065*    (2006.01)
*H01J 1/18*    (2006.01)
(Continued)

(52) U.S. Cl.
CPC .............. *H01J 37/065* (2013.01); *H01J 1/18* (2013.01); *H01J 1/88* (2013.01); *H01J 3/024* (2013.01);
(Continued)

(58) Field of Classification Search
CPC ............. H01J 37/065; H01J 1/88; H01J 3/024
See application file for complete search history.

(56) References Cited

U.S. PATENT DOCUMENTS 8,987,982 B2    3/2015  Magera et al.
10,468,220 B1   11/2019 Jerez et al.
(Continued)

FOREIGN PATENT DOCUMENTS

EP          0627121     4/1998
JP        2005190758    7/2005
(Continued)

OTHER PUBLICATIONS

Calame, et al., "Applications of Advanced Materials Technologies to Vacuum Electronic Devices", Proceedings of the IEEE, vol. 87, 1999, 25 pages.
(Continued)

*Primary Examiner* — Joseph L Williams
(74) *Attorney, Agent, or Firm* — Brooks, Cameron & Huebsch, PLLC (57) ABSTRACT

The present invention relates to an electron gun cathode mount adapted at one end to secure a thermionic cathode and at the other end to be connected to an attachment member, wherein the electron gun cathode mount is structured so as to be capable of, when in use, reducing heat transfer from the thermionic cathode to the attachment member, and the material forming the electron gun cathode mount has a thermal conductivity of less than 10 $Wm^{-1}K^{-1}$ at the operating temperature of the thermionic cathode in a direction from the thermionic cathode to the attachment member. The present invention also relates to an electron gun assembly having the electron gun cathode mount installed therein.

21 Claims, 7 Drawing Sheets

(51) Int. Cl.
*H01J 1/88* (2006.01)
*H01J 3/02* (2006.01)

(52) U.S. Cl.
CPC ....... *H01J 2201/19* (2013.01); *H01J 2203/02* (2013.01)

(56) References Cited

U.S. PATENT DOCUMENTS

| | | |
|---|---|---|
| 11,948,769 B2 * | 4/2024 | Magera .................... H01J 1/22 |
| 2013/0162134 A1 | 6/2013 | Mattausch et al. |

FOREIGN PATENT DOCUMENTS

| | | |
|---|---|---|
| JP | 6283554 | 2/2018 |
| WO | 99/16101 | 4/1999 |

OTHER PUBLICATIONS

Roy, et al., "Study of a laser-heated electron gun", Rev. Sci. Instrum., vol. 67, No. 12, Dec. 1996, 6 pages.

* cited by examiner

ELECTRON GUN CATHODE MOUNT

FIELD OF INVENTION

The present invention relates to an electron gun cathode mount for securing a thermionic cathode in an electron gun assembly.

BACKGROUND OF THE INVENTION

Electron gun assemblies are commonly employed across a wide variety of applications including in cathode ray tubes, electron microscopes, particle accelerators and apparatus for electron beam processing.

In electron beam processing operations such as welding and materials processing, many of the electron gun assemblies employed use a thermionic cathode as the electron source. These thermionic cathodes are formed of a refractory material such as lanthanum hexaboride, and are heated by a heat source to a temperature where electrons can escape from the surface thereof and be accelerated, usually by a potential difference between the thermionic cathode and an anode disposed in front of it, towards an intended target. Typically, an additional electrode is also disposed within the electron gun assembly in the region of the thermionic cathode to shape and control the electron beam characteristics. In these electron gun assemblies, the thermionic cathode may be heated by passing a current through the thermionic cathode via a supporting structure (cathode mount), said cathode mount holding the thermionic cathode within the electron gun assembly. This type of heating is commonly known as direct heating, or resistance heating. The current passes through the supporting structure and thus the thermionic cathode, facilitating thermal conduction in a direction from the heat source to the thermionic cathode. Direct heating electrons gun assemblies are depicted in EP 0627121A, WO 99/16101 A2, JP 2005190758 A and U.S. Pat. No. 8,987,985 B2. Alternatively, heat may be indirectly supplied to the thermionic cathode other than via the supporting structure using, for example, laser impingement or a primary electron beam (back bombardment) (commonly known as indirect heating). No current is passed through the supporting structure and thermionic cathode for the purposes of heating the thermionic cathode via resistance heating. An electron gun assembly of this type is depicted in 'Study of a laser-heated electron gun', Roy et al., Rev. Sci. Instrum., Vol. 67, No. 12, December 1996.

In these known electron gun assemblies, the portion of the supporting structure holding the thermionic cathode within the electron gun assembly is also required to be compatible with the high temperature and vacuum conditions necessary for the thermionic cathode to emit electrons in a controlled fashion. For example, this portion of the supporting structure holding the thermionic cathode should, when in use in an electron gun assembly such as a diode electron gun assembly, help to reduce side emissions of electrons and should not emit any itself. Accordingly, said portions of the supporting structures are commonly formed of materials having a much higher work function than the thermionic cathode. For example, where the thermionic cathode is made from a low work function material such as lanthanum hexaboride, the portion of the supporting structure is typically formed of tantalum or the like.

However, problems exist with the electron gun assemblies described above, in particular regarding the supporting structures for the thermionic cathodes.

For electron gun assemblies utilising thermionic cathodes, the efficiency of electron beam output is linked in part to the thermal energy input required from the heat source to maintain the thermionic cathode at the appropriate temperature for electron emission. Maintenance of this stable temperature is key to controlling the efficiency of electron output. The lower this efficiency, the more powerful and likely more expensive a heat source is required, and the greater the requirements placed on the thermal management of the electron gun assembly.

One way in which thermal energy is lost from thermionic cathodes in known electron gun assemblies is via the supporting structure. Although capable of withstanding the high temperature and vacuum conditions necessary in electron gun assemblies, the thermal conductivity of materials having high work function such as tantalum typically remains high, or even increases, as temperature increases within the assembly upon heating of the thermionic cathode. For example, whilst metallic tantalum has a thermal conductivity at 293 K of 57.5 W m$^{-1}$K$^{-1}$, at 1800 K this increases to 63 W m$^{-1}$K$^{-1}$. Thermal energy is thus lost via the portions of the supporting structure that are formed from these refractory materials such as tantalum. In addition, thermal energy is lost from any other portions of the supporting structure formed of thermally conductive materials. Whilst there is some latitude to alter the physical configuration of the supporting structures or parts thereof, for example by minimising contact area with the thermionic cathode using thin 'fingers' of material or such like, the necessity of utilising materials which are compatible with the extreme conditions within an electron gun assembly has meant that, in spite of the thermal efficiency drawbacks discussed above, current electron gun assembly design typically persists with using tantalum and other refractory materials for holding thermionic cathodes formed of lanthanum hexaboride and the like.

It is therefore desirable to provide an electron gun cathode mount capable of securing a thermionic cathode in an electron gun assembly, and which is also capable of reducing heat transfer from the thermionic cathode to the rest of the electron gun assembly following the application of heat to the thermionic cathode to facilitate emittance of electrons.

SUMMARY OF THE INVENTION

According to a first aspect of the present invention, there is provided an electron gun cathode mount adapted at one end to secure a thermionic cathode and at the other end to be connected to an attachment member, wherein the electron gun cathode mount is structured so as to be capable of, when in use, reducing heat transfer from the thermionic cathode to the attachment member, and the material forming the electron gun cathode mount has a thermal conductivity of less than 10 Wm$^{-1}$K$^{-1}$ at the operating temperature of the thermionic cathode in a direction from the thermionic cathode to the attachment member.

According to a second aspect of the present invention, there is provided an electron gun assembly comprising an electron gun cathode mount securing a thermionic cathode at one end and connected to an attachment member at the other, wherein the electron gun cathode mount is structured so as to be capable of, when in use, reducing heat transfer from the thermionic cathode to the attachment member, and the material forming the electron gun cathode mount has a thermal conductivity of less than 10 Wm$^{-1}$K$^{-1}$ at the operating temperature of the thermionic cathode in a direction from the thermionic cathode to the attachment member.

DETAILED DESCRIPTION OF THE INVENTION

It has been surprisingly and advantageously found that, in use in an electron gun assembly, following application of heat to the thermionic cathode, the electron gun cathode mount of the present invention is capable of reducing heat transfer from the thermionic cathode to the attachment member. This electron gun cathode mount provides improved operational stability and power efficiency for electron gun assemblies. The amount of thermal energy lost via the electron gun cathode mount is significantly reduced such that, when the mount is in use in an electron gun assembly, the thermionic cathode can be heated to and maintained at the stable temperature required to efficiently emit electrons therefrom without increasing the power of the heat source. Electron beam emission is thus highly efficient when the electron gun cathode mount of the present invention is utilised in electron gun assemblies.

In the context of the present invention, the term "heat transfer" and like terms used in refers to the movement of thermal energy (heat), i.e. thermal conduction. The two terms "heat transfer" and "thermal conduction" are utilised interchangeably. In the context of the present invention, when the electron gun cathode mount is in use in an electron gun assembly, thermal conduction from the thermionic cathode to the attachment member via the electron gun cathode mount is reduced.

The end of the electron gun cathode mount of the present invention which is adapted to secure the thermionic cathode is configured to be in contact with the thermionic cathode in order to hold the thermionic cathode in place. Typically, the end of the electron gun cathode mount adapted to secure the thermionic cathode comprises an opening into which the thermionic cathode is positioned and held in place. It will therefore be appreciated that the opening will typically be complimentary in shape with the shape of the thermionic cathode. Preferably, the opening into which the thermionic cathode is positioned may be configured such that the end of the electron gun cathode mount adapted to secure the thermionic cathode surrounds the thermionic cathode. Preferably, part of the end of the electron gun cathode mount adapted to secure the thermionic cathode surrounds the thermionic cathode. Alternatively, the opening into which the thermionic cathode is positioned may be configured such that the end of the electron gun cathode mount adapted to secure the thermionic cathode does not surround the thermionic cathode. In such instances, it will be appreciated that, although not completely surrounding the thermionic cathode, this contact will be sufficient to not only enable the thermionic cathode to be securely held in place, but will also be sufficient so as to control and mitigate side-emission or escaping electrons from the thermionic cathode. Such configurations will be known to a skilled person.

The electron gun cathode mount may be any suitable shape or structure. For example, the electron gun cathode mount may have a tubular structure. The tubular structure typically comprises a wall(s) surrounding an interior space. It will be appreciated that, as required for the electron gun cathode mount of the present invention, one end of the tubular structure is adapted so as to secure a thermionic cathode, whilst the other end of the tubular structure is adapted so as to connect to an attachment member. The term tubular structure encompasses any three-dimensional hollow structure comprising an interior space (i.e. a wall(s) surrounding an interior space) such as, for example cylindrical and conical structures. It will be appreciated that, when the electron gun cathode mount is installed in an electron gun assembly, in use, it is through the interior space within the hollow structure that thermal energy from the heat source is applied to the thermionic cathode (the back portion thereof) held by the electron gun cathode mount.

The wall(s) of the tubular structure may have any suitable thickness. Typically, the thickness of the wall(s) of the tubular structure is from 0.05 to 2 mm.

The wall(s) of the tubular structure may be continuous, i.e. comprise no openings and/or material discontinuities therein. Alternatively, the wall(s) or at least a portion of the wall(s) of the tubular structure may comprise openings and/or material discontinuities therein, i.e. may be non-continuous. An example of such would be a lattice structure. In the case of a lattice structure, the wall(s) may be constructed in the form of a lattice or grid.

When the wall(s) of the tubular structure have a lattice structure, the electron gun cathode mount may further comprise an outer layer or sleeve which surrounds the wall(s) of the lattice structure. This outer layer or sleeve may be formed from the same material as the electron gun cathode mount. For example, the outer layer or sleeve may be formed from pyrolytic graphite orientated as discussed below. Alternatively, this outer layer or sleeve may be formed from a refractory metal such as tantalum. This outer layer or sleeve is typically continuous, i.e. comprises no openings and/or material discontinuities therein. The outer layer or sleeve is typically in poor thermal contact with the wall(s) of the lattice structure to prevent heat conduction as far as practically possible via this route. It will be appreciated that such an outer layer or sleeve controls side-emission and escape of electrons.

Alternatively, the electron gun cathode mount may be formed from multiple individual components that together form a structure capable of securing the thermionic cathode at one end and to be connected to the attachment member at the other. Such a structure also creates an interior space through which thermal energy from the heat source is supplied to the thermionic cathode. In the art, the individual components of such structures are typically known as rods, fingers or legs. Said individual components may have a thickness of from 0.05 to 2 mm.

Preferably, the electron gun cathode mount of the present invention has a tubular structure, more preferably a cylindrical or conical structure. Preferably, the wall(s) of the tubular structure, such as of the cylindrical or conical structure, are continuous.

The electron gun cathode mount may be of any suitable size for use in standard electron gun assemblies. Appropriate sizes will be well known to a skilled person, and will be dependent upon the size of the thermionic cathode and overall electron gun assembly. Preferably, the length of the electron gun cathode mount is 2 mm or more, such as from 15 to 25 mm. By length of the electron gun cathode mount is meant the minimum distance from end to end thereof, i.e. from the end of the electron gun cathode mount adapted to secure the thermionic cathode to the other end of the electron gun cathode mount adapted to be connected to an attachment member. Such a minimum distance enables the electron gun cathode mount of the present invention to reduce thermal conduction (heat transfer) therethrough from the thermionic cathode to the attachment member when in use in an electron gun assembly. It will be appreciated that when the electron gun cathode mount has a conical structure, the minimum distance is that along the length of the wall(s) of the conical structure, not along the central axis of the conical structure.

The electron gun cathode mount of the present invention may be formed of any material capable of reducing heat transfer from the thermionic cathode to the attachment member therethrough, i.e. from one end to the other end of the electron gun cathode mount. As discussed in more detail below, such material has a low thermal conductivity at the operating temperature of the thermionic cathode in the direction from the thermionic cathode to the attachment member. It will be appreciated that the material does not need to demonstrate such thermal insulation properties in all directions, but be simply able to reduce thermal conduction therethrough in at least the direction from the thermionic cathode to the attachment member. This may be, for example, through appropriate orientation of the material during formation of the electron gun cathode mount. It will be further appreciated that such materials must also be able to demonstrate high temperature vacuum stability, a low coefficient of thermal expansion and suitability to electron gun assemblies and applications.

The material forming the electron gun cathode mount has a thermal conductivity of less than 10 $Wm^{-1}K^{-1}$ at the operating temperature of the thermionic cathode. This thermal conductivity is in a direction from the thermionic cathode to the attachment member through the electron gun cathode mount. Preferably, the material forming the electron gun cathode mount has a thermal conductivity of less than 3 $Wm^{-1}K^{-1}$ at the operating temperature of the thermionic cathode, in a direction from the thermionic cathode to the attachment member. More preferably, the material forming the electron gun cathode mount has a thermal conductivity of less than 1.5 $Wm^{-1}K^{-1}$ at the operating temperature of the thermionic cathode, in a direction from the thermionic cathode to the attachment member. For the present invention, the definition of thermal conductivity is in accordance with ASTM E1225-20, Standard Test Method for Thermal Conductivity of Solids Using the Guarded-Comparative-Longitudinal Heat Flow Technique.

The operating temperature of the thermionic cathode may be from 1600 to 2800K. In the context of the present invention, the operating temperature of the thermionic cathode is the temperature at which the thermionic cathode emits electrons, i.e. the temperature to which it must be heated for it to emit electrons when in use in an electron gun assembly.

The material forming the electron gun cathode mount may be a single material, or a combination of different materials, including for example, a primary material having a secondary material coated thereon or introduced therein. It will be appreciated that in both cases, the material forming the electron gun cathode mount will have the required thermal conductivity.

Suitable materials from which the electron gun cathode mount may be formed, include, but are not limited to the following: ceramic materials such as those based upon zirconia, for example yttria-stabilised zirconia, and alumina; carbon-carbon composites; sintered metallic materials; and pyrolytic graphite.

For the ceramic materials such as those based upon zirconia, for example yttria-stabilised zirconia, and alumina, the thermal conductivity of the material can be adjusted during manufacture, such as by introducing controlled porosity. The ceramic materials may also be provided with a thin coating of electrically conductive material, for example tantalum, in such amounts so as not to raise the thermal conductivity of the material above that required for the present invention (primary material having a secondary material coated thereon). A thin coating in this context is typically less than 200 μm, preferably less than 100 μm, and more preferably less than 2 μm. When such coated ceramic materials are utilised, the thickness of the wall(s) of the electron gun cathode mount is typically greater than 0.5 mm.

Typical methods of manufacture of the ceramic materials will be well known to a skilled person in the art, and may include casting and spraying technologies, for example thermal spray technologies including plasma spraying. The coating of electrically conductive material may be deposited using a variety of known techniques, including as a foil, by vapour deposition, by chemical deposition or by spraying (e.g. thermal spray technologies, such as plasma spraying and cold spraying).

The carbon-carbon composites can be designed in such a way as to have highly anisotropic thermal conductivity. For example, phenolic densified carbon-carbon composites can be produced that have thermal conductivities in the out-of-plane (relative to bond planes) direction of <6 $W\ m^{-1}K^{-1}$ at 1720K.

Sintered metallic materials include tungsten and tantalum where the density of material is controlled by inclusion of porosity or other (secondary) materials so as to lower the thermal conductivity to that required by the present invention, without compromising performance. Tantalum can also be fabricated using energy beam additive manufacturing routes with varying pore fractions. These routes can be used to fabricate metals with pore fractions in the range of 20 to 80%.

Preferably, the electron gun cathode mount is formed of a single material. Preferably, the material forming the electron gun cathode mount has anisotropic thermal conductivity. By anisotropic thermal conductivity is meant that the material is capable of changing or assuming different thermal conductivities in different directions of the material. Preferably, the electron gun cathode mount is formed of pyrolytic graphite.

Pyrolytic graphite refers to a material having a highly ordered structure formed of planar graphene layers having some interlayer covalent bonding therebetween. Specifically, pyrolytic graphite comprises planar layers of hexagonally-arranged carbon atoms, along which high thermal conduction can be achieved in the planar direction. However, these planar layers are arranged with respect to each other such that in the direction transverse to, preferably perpendicular to, the planar layers, the carbon atoms are randomly orientated and thermal conduction in such a direction is significantly reduced. It is the manufacture of the pyrolytic graphite that leads to this very particular structure. Pyrolytic graphite is manufactured by the decomposition of hydrocarbon gas at high temperature (pyrolysis). Control of this pyrolysis process leads to formation of a material which provides high thermal conductivity along its planar layers, whilst reducing thermal conduction in a direction transverse, preferably perpendicular, thereto. Pyrolytic graphite is thus considered to be anisotropic in nature with respect to thermal conductivity. Furthermore, it is noted that the thermal conductivity of pyrolytic graphite in a direction transverse to, preferably perpendicular to, the planar layers in fact decreases as temperature increases. In addition, pyrolytic graphite is very stable at electron gun assembly operating temperatures. Pyrolytic graphite has been shown to display thermal conductivity of <1 $Wm^{-1}K^{1}$ above 1720K in the direction transverse to, preferably perpendicular to, the above-described planar layers. These properties of pyrolytic graphite make it an excellent material from which to form the electron gun cathode mount of the present invention.

The electron gun cathode mount may be formed of pyrolytic graphite comprising planar layers preferentially orientated so as to minimise thermal conduction along the electron gun cathode mount in the direction from the thermionic cathode to the attachment member. In practice, this means that none of the planar layers extend along the length of the electron gun cathode mount. By the length of the electron gun cathode mount is meant from the end of the electron gun cathode mount capable of securing the thermionic cathode to the end of the electron gun cathode mount adapted to be connected to the attachment member. It will be appreciated that the planar layers will be orientated at an angle that prevents any of the planar layers extending along a length from one end to the other of the electron gun cathode mount of the present invention. Such a configuration means that, when the electron gun cathode mount is in use in an electron gun assembly, both securing a thermionic cathode and connected to the attachment member and thus, the rest of an electron gun assembly, none of the planar layers extend from the thermionic cathode to the attachment member along the length of the electron gun cathode mount. This specific orientation of graphite layers means that when the electron gun cathode mount is in use in an electron gun assembly, heat transfer from the thermionic cathode to the attachment member, and thus the rest of the electron gun assembly, is reduced. When the electron gun cathode mount is in use in an electron gun assembly, no planar layer of the pyrolytic graphite extends through the length of the electron gun cathode mount from the end of the electron gun cathode mount adapted to secure the thermionic cathode to the end of the electron gun cathode mount adapted to be connected to the attachment member. Simply, there is no direct planar path formed between the thermionic cathode and the attachment member. The thermionic cathode can thus be substantially thermally isolated from the rest of the electron gun assembly such that its temperature is maintained, thermal energy loss is significantly reduced and a heat source of increased power is not required to facilitate emission of electrons in an electron gun assembly.

Since pyrolytic graphite is anisotropic with respect to thermal conductivity, it should be understood that the planar layers are oriented so as to reduce thermal conduction through the electron gun cathode mount from the thermionic cathode to the attachment member, and thus the rest of the electron gun assembly.

When the electron gun cathode mount has a cylindrical structure, the electron gun cathode mount may be formed of pyrolytic graphite comprising planar layers orientated transverse to, preferably perpendicular to, the length of the cylindrical structure. It will be appreciated that when the electron gun cathode mount has a cylindrical structure, the planar layers are preferentially orientated so as to reduce thermal conduction along the length of the cylindrical structure.

When the electron gun cathode mount has a conical structure, the electron gun cathode mount may be formed of pyrolytic graphite comprising planar layers orientated transverse to, preferably perpendicular to, the central axis of the conical structure. It will be appreciated that when the electron gun cathode mount has a conical structure, the planar layers are preferentially orientated so as to reduce thermal conduction along the length of the conical structure.

The electron gun cathode mount of the present invention may be formed by any suitable manufacturing method. When the electron gun cathode mount is to be formed from pyrolytic graphite, the electron gun cathode mount may be made following established routes for the manufacture of pyrolytic graphite, primarily via chemical vapour deposition and heating of hydrocarbons in pyrolysis reactions, and subsequent machining operations. In addition to its ability to reduce thermal conduction when orientated as discussed above, pyrolytic graphite can be easily machined without the need for frequent machine de-clogging and cleaning.

The electron gun cathode mount of the present invention can also be manufactured using three dimensional (3D) shaping techniques, i.e. additive manufacturing, or by machining, etching or laser cutting of a preform. For example, when the electron gun cathode mode is formed from pyrolytic graphite, highly complex forms of pyrolytic graphite can be achieved by 3D printing a resin precursor, carrying out any required post-printing forming steps (e.g. machining) and a pyrolysis operation. Adequate allowance needs to be made for pressurisation of the preform during pyrolysis to achieve the directional properties required. This process enables the electron gun cathode mount to have any suitable shape or structure, including lattice structures, optimised via simulation and modelling operations to take advantage of the anisotropic properties of pyrolytic graphite to enable high levels of thermal control.

Where control of escaping electrons is required for lattice structures as discussed above, this can be achieved by either 3D printing the electron gun cathode mount with an outer layer or sleeve, typically continuous and typically of the same material, in the same or separate operation, or by disposing the lattice structure within an outer layer or sleeve.

The thermionic cathode for use with the electron gun cathode mount of the present invention may be formed from any suitable material capable of emitting electrons from it surface upon application of thermal energy thereto. Such materials will be well known to a person skilled in the art. Suitable materials include, but are not limited to: cerium hexaboride, lanthanum hexaboride, tantalum, tungsten, molybdenum and transition metal carbides (e.g. carbides of tantalum, tungsten or molybdenum). Preferably, the material from which the thermionic cathode is formed is lanthanum hexaboride. It will be appreciated that in the context of the present invention, the thermionic cathode must be one suitable for use with an indirect heat source as discussed below.

The thermionic cathode for use with the electron gun cathode mount of the present invention may have any suitable shape. Typically, the thermionic cathode will have a front and back portion and a side(s), such as seen in a button shape. The front portion includes the portion of the thermionic cathode from which electrons are intended to be emitted and faces away from any heat source. The back portion includes the portion of the thermionic cathode to which thermal energy from the heat source is applied when the electron gun cathode mount is installed in an electron gun assembly and faces towards the interior space of the electron gun cathode mount structure.

The electron gun cathode mount of the present invention is designed to be used with an indirect heat source in an electron gun assembly. By indirect heat source is meant an entity that applies thermal energy to the thermionic cathode to achieve emittance of electrons therefrom, the thermal energy being applied other than via the electron gun cathode mount. The indirect heat source and electron gun cathode mount are separate. It will be appreciated that, when the electron gun cathode mount of the present invention is utilised in an electron gun assembly, the indirect heat source may contact the thermionic cathode or alternatively, and more commonly, will not be in contact with the thermionic cathode. Typically, the indirect heat source will provide a heat flux (heat input) to the thermionic cathode of 25 to 100 W/mm$^2$. By "heat flux" as discussed herein, is meant the flow of energy per unit of area per unit of time. The term may be interchangeably used with the term "thermal flux". It will be appreciated that the thermionic cathode requires a minimum heat flux to be applied thereto such that it reaches the temperature required for the emittance of electrons (operating temperature). It will further be appreciated that there is a relationship between the required minimum heat flux and the power of the heat source. In particular, the thermal energy may be applied over an area in order that the intensity of the heat source is below any level that might cause erosion of the back portion of the thermionic cathode to which the thermal energy is applied. For example, the thermal energy may be applied with a laser beam defocused across the exposed back portion of the thermionic cathode having a spot diameter approaching the diameter of the thermionic cathode.

For the electron gun cathode mount of the present invention, when in use in an electron gun assembly, no current is passed through the electron gun cathode mount and thermionic cathode for the purpose of heating the thermionic cathode via resistance heating. An indirect heat source is utilised instead.

The end of the electron gun cathode mount of the present invention other than that adapted to secure the thermionic cathode is adapted to be connected to an attachment member. This end of the electron gun cathode mount may be connected to the attachment member by any suitable attachment means, which will be well known to those skilled in the art. For example, the end of the electron gun cathode mount adapted to be connected to the attachment member may comprise a laterally outwardly extending flange portion which enables the electron gun cathode mount to be connected to the attachment member. If said end of the electron gun cathode mount comprises a laterally outwardly extending flange portion, the attachment member may comprise a rebate which form-fits together with the flange portion to connect the electron gun cathode mount to the attachment member. The end of the electron gun cathode mount and the attachment member may be further held in position by additional attachment means, such as a clamping plate and screws. Typically, the attachment member may be formed of stainless steel. Typically, the attachment member comprises venting holes to ensure that no gases are trapped when vacuum conditions are applied during set-up and operation of an electron gun assembly.

Attachment of the electron gun cathode mount into an electron gun assembly is achieved via the attachment member. Typically, the attachment member is connected to an electron gun body comprising an additional electrode operable to shape and control the emission of the electron beam. This electron gun body is then connected to the remaining electron gun apparatus, such as that comprising the heat source, to form an electron gun assembly. It will therefore be appreciated that the attachment member enables the electron gun cathode mount of the present invention to be installed in an electron gun assembly. In particular, the attachment member enables the electron gun cathode mount to be located in the correct position in the electron gun assembly. Typically, when the electron gun assembly is in use, the additional electrode is held at the same potential as the thermionic cathode and aids in shaping and controlling the electron beam.

Accordingly, there is provided the electron gun assembly according to the second aspect of the present invention.

All features relating to the electron gun assembly, electron gun cathode mount, heat source, attachment member and thermionic cathode discussed above in relation to the first aspect of the present invention, whether preferred or optional, are applicable to this second aspect of the present invention.

Preferably, the electron gun assembly further comprises an indirect heat source as described above.

Heating of the thermionic cathode to achieve emittance of electrons therefrom does not take place via the electron gun cathode mount of the present invention. There is no current passed through the electron gun cathode mount and thermionic cathode for the purpose of heating the thermionic cathode via resistance heating. With an indirect heat source, the thermal energy applied to the thermionic cathode to achieve emittance of electrons therefrom is applied other than via the electron gun cathode mount. The indirect heat source and electron gun cathode mount are separate. As noted above, when the electron gun cathode mount of the present invention is utilised in an electron gun assembly, the indirect heat source may contact the thermionic cathode or alternatively, and more commonly, will not be in contact with the thermionic cathode.

Suitable indirect heat sources for the application of thermal energy to the thermionic cathode other than via the electron gun cathode mount, will be well known to a skilled person. Suitable indirect heat sources include, but are not limited to: one or more laser source(s), radio frequency (RF) electron beam emitter(s), radiant heaters or electron beam emitters. Preferably, the heat source is a laser source(s) or a radio frequency (RF) electron beam emitter. Preferably, the heat source provides thermal energy in the form of a laser beam or a radio frequency (RF) beam, more preferably a laser beam.

Typically, the indirect heat source provides a heat flux to the thermionic cathode of 25 to 100 W/mm$^2$. Such a heat flux will heat the thermionic cathode to an operating temperature of from 1600 to 2800K, as required for the thermionic cathode to emit electrons.

As discussed above in relation to the first aspect of the present invention, in the electron gun assembly according to the second aspect of the present invention, the electron gun cathode mount secures a thermionic cathode and is typically installed in the electron gun assembly via an attachment member. As further discussed above, this attachment member is itself typically installed into an electron gun body comprising an additional electrode. This electron gun body is then connected to the remaining electron gun apparatus, such as that comprising the indirect heat source, to form an electron gun assembly. The electron gun assembly of the second aspect of the present invention may therefore further comprise an electron gun body comprising an additional electrode, in which the electron gun cathode mount is installed via the attachment member. The additional electrode of the electron gun body may be as discussed above and is operable to shape and control the emission of the electron beam. Typically, when the electron gun assembly of the second aspect of the present invention is in use, the additional electrode is held at the same potential as the thermionic cathode. In such instances, the electron gun assembly is known as a diode electron gun assembly, but the invention is also applicable to triode guns in which the additional electrode may be held at a greater negative potential than the cathode, and is called a bias cup, grid or Wehnelt electrode.

In the electron gun assembly according to the second aspect of the present invention, the heat source is an indirect heat source as discussed above in relation to the first aspect of the present invention. In the electron gun assembly of the second aspect of the present invention, the thermal energy applied by the indirect heat source is applied other than via the electron gun cathode mount according to the first aspect of the present invention. The heat source and the electron gun cathode mount are separate. When the electron gun cathode mount of the first aspect of the present invention is in use in the electron gun assembly according to the second aspect of the present invention, no thermal energy is applied to the thermionic cathode from the indirect heat source via the electron gun cathode mount. It will be appreciated that, in use, when the electron gun cathode mount according to the first aspect of the present invention is installed in the electron gun assembly according to the second aspect of the present invention and thermal energy applied to the thermionic cathode from the indirect heat source, the electron gun cathode mount reduces heat transfer from the thermionic cathode to the attachment member.

In the electron gun assembly according to the second aspect of the present invention, the indirect heat source is positioned so as to be capable of applying thermal energy to the back portion of the thermionic cathode of the electron gun cathode mount of the first aspect of the present invention, i.e. the portion of the thermionic cathode facing the interior space of the electron gun cathode mount when attached into the electron gun body and thus the electron gun assembly.

The electron gun cathode mount and electron gun assembly of the first and second aspects of the present invention may be utilised in a wide variety of applications including in cathode ray tubes, electron microscopes, particle accelerators and electron beam processing including melting, welding and material processing. Preferably, the electron gun cathode mount and electron gun assembly are utilised in electron beam processing including melting, welding and material processing applications.

The electron gun cathode mount and electron gun assembly of the first and second aspects of the present invention can be used in the provision of electron beams having a power of from 100 W in low power marking applications up to 1 MW for high power welding or melting in electron beam processing. Accordingly, the electron gun cathode mount and electron gun assembly of the first and second aspects of the present invention can be used in the provision of high power electron beams. Preferably, the electron gun cathode mount and electron gun assembly are used in the provision of electron beams having a power in the range of from 1 to 100 kW. Preferably, the electron gun cathode mount and electron gun assembly are utilised in applications requiring an electron beam having a power in the range of from 1 to 100 kW.

All of the features contained herein may be combined with any of the above aspects and in any combination.

For a better understanding of the invention and to show embodiments of the same may be carried into effect, reference will now be made, by way of example, to the accompany drawings in which.

Figure 1:
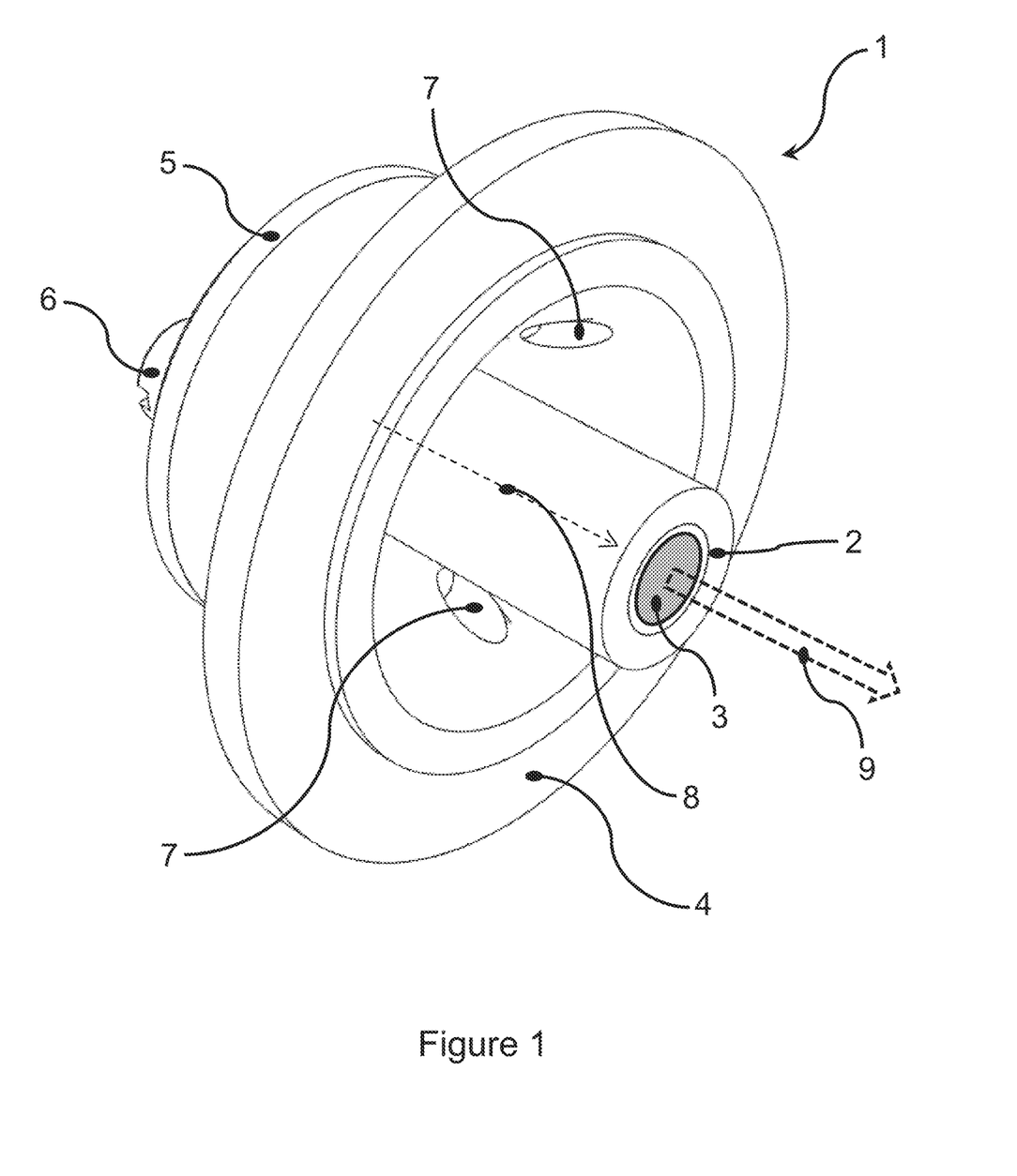
FIG. 1 shows a cathode mount assembly comprising the electron gun cathode mount according to the first aspect of the present invention.

FIG. 1 shows a cathode mount assembly 1, which is comprised of an electron gun cathode mount (cathode mount) 2 of pyrolytic graphite which secures thermionic cathode 3 (e.g. lanthanum hexaboride button). Since pyrolytic graphite is anisotropic with respect to thermal conductivity, it should be understood that the planar layers are oriented so as to minimise thermal conduction along the length of the cylindrical structure of the electron gun cathode mount 2, i.e. the planar layers are oriented transverse to, preferably perpendicular to, the length of the electron gun cathode mount 2. The cathode mount assembly 1, and thus electron gun cathode mount 2, is mounted into the electron gun body (shown in FIG. 2) via attachment member (locating disc) 4, which is typically made of stainless steel, the locating disc also functioning as a precise centering/locating means for positioning the electron gun cathode mount 2 and thermionic cathode 3. The locating disc 4 is rebated (not shown), and the electron gun cathode mount 2 has a flange (not shown) which mates with the rebate in the locating disc 4 to form-fit together. The locating disc 4 and electron gun cathode mount 2 when fitted together are secured using additional attachment means (a clamping plate 5, and tightened clamping screws 6). The locating disc 4 has venting holes 7, which ensure no trapped gases when the cathode mount assembly 1 is subject to vacuum conditions during set up and operation of the electron gun assembly into which it is installed. The heat source (e.g. laser) (not shown) for the thermionic cathode 3 is directed down the bore of electron gun cathode mount 2 as shown by arrow 8, to impact the back of the thermionic cathode 3, which is thereby heated and emits a beam of electrons 9. The electron gun cathode mount 2 in this figure is shown as having a cylindrical structure, which typically has a wall that is as thin as possible to minimise heat transfer, although other cathode holder shape forms are possible, depending upon the specific requirements of the cathode and electron gun.

Figure 2:
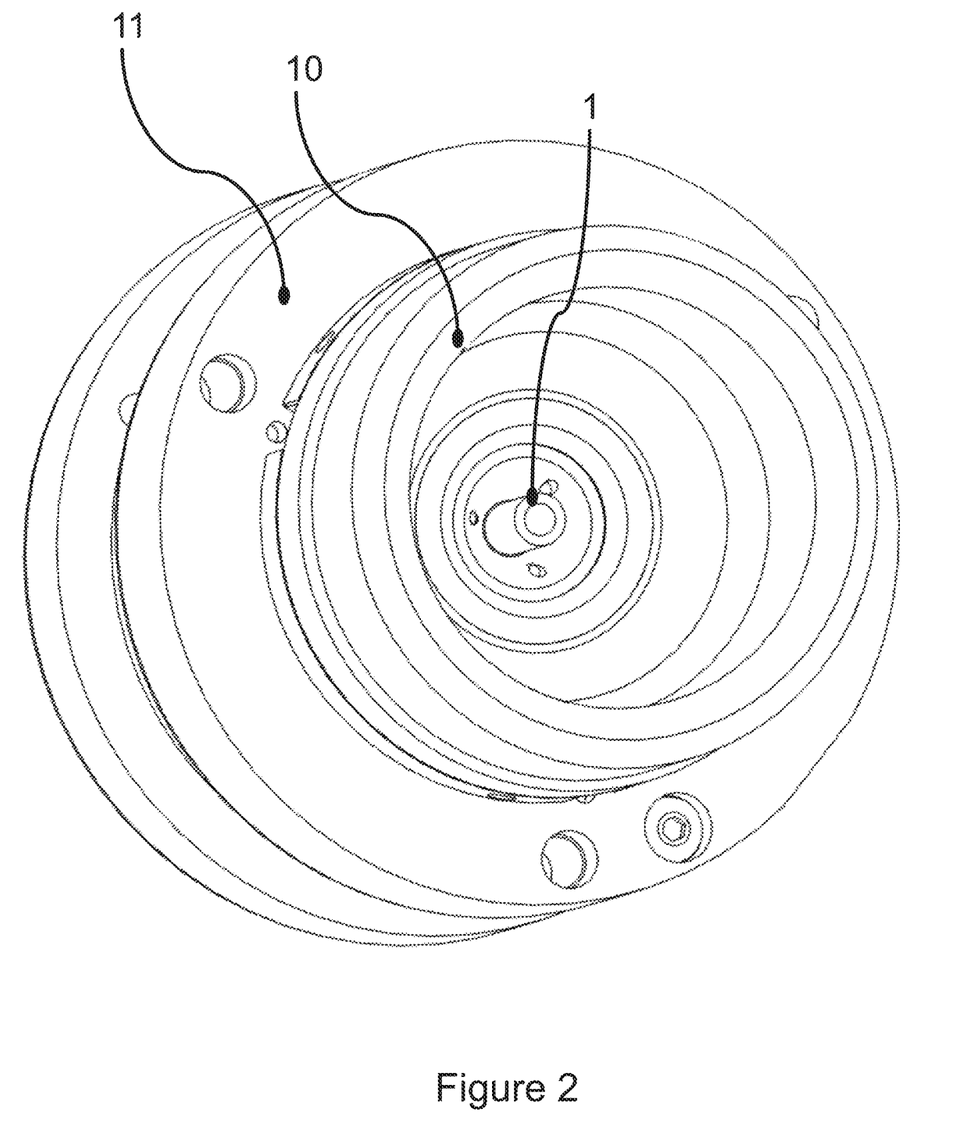
FIG. 2 shows the cathode mount assembly of FIG. 1 mounted in an electron gun body.

In FIG. 2, the cathode mount assembly 1 is mounted central to an additional electrode (the gun cathode) 10 in the electron gun body 11. The gun cathode 10 is held at the same potential as the thermionic cathode 3 of the cathode mount assembly 1 (see FIG. 1) for a diode gun, and aids in shaping, controlling and projecting the electron beam. The electron gun body 11 provides the means for mounting the cathode mount assembly 1, and thus the electron gun cathode mount 2 of FIG. 1, within the greater structure of an electron gun assembly (electron beam processing apparatus).

Figure 3:
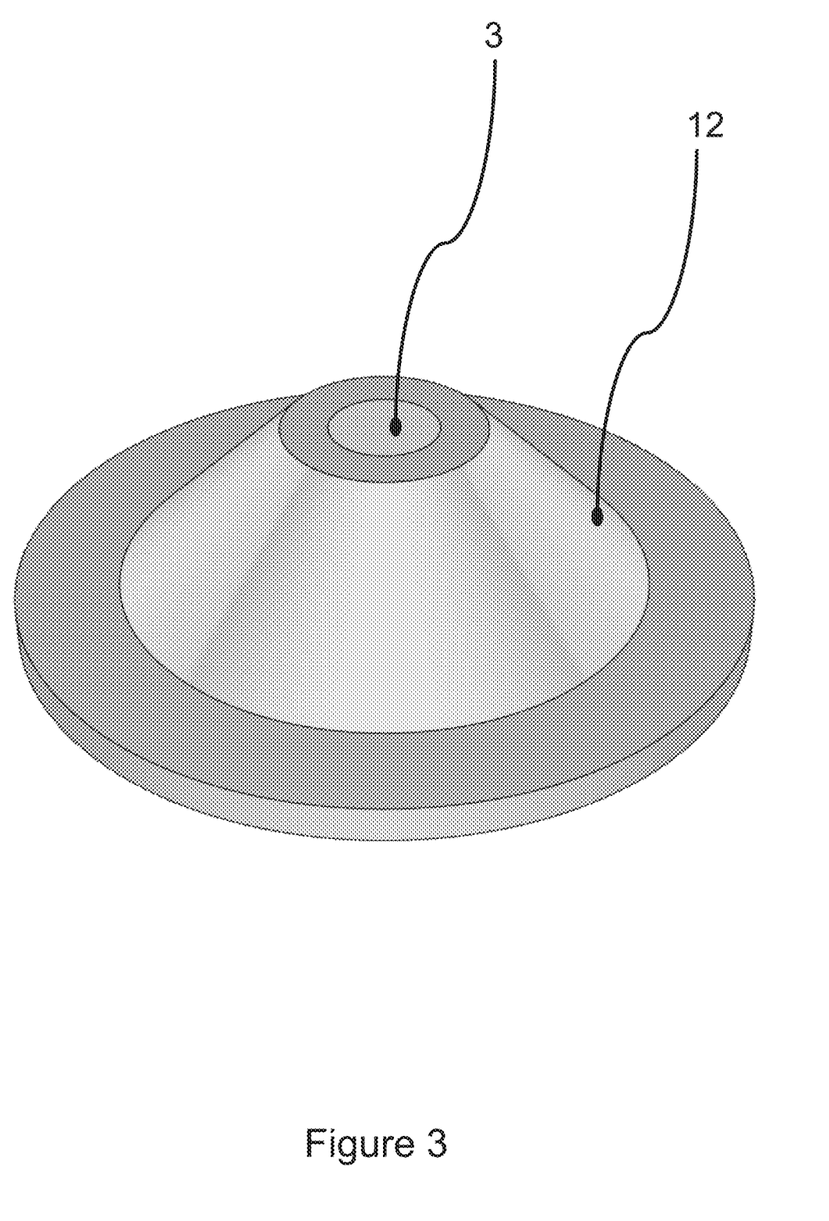
FIG. 3 shows an electron gun cathode mount according to the first aspect of the invention having a conical structure.

FIG. 3 shows an electron gun cathode mount (cathode holder) 12 having a tubular structure (a conical structure) formed of pyrolytic graphite, with the thermionic cathode 3 (lanthanum hexaboride) held at the apex. The electron gun cathode mount 12 is fabricated by machining from a block of pyrolytic graphite. Since pyrolytic graphite is anisotropic with respect to thermal conductivity, it should be understood that the planar graphite layers are oriented so as to minimise thermal conduction along the length of the electron gun cathode mount 12, i.e. from the apex of the cone (where the thermionic cathode 3 is held) to the base (where the cathode holder 12 contacts and is operable to connect to the attachment member (not shown) via the laterally outwardly extending flange portion). In FIG. 3, the planar layers are oriented transverse to, preferably perpendicular to, the central axis of the conical structure.

Figure 4:
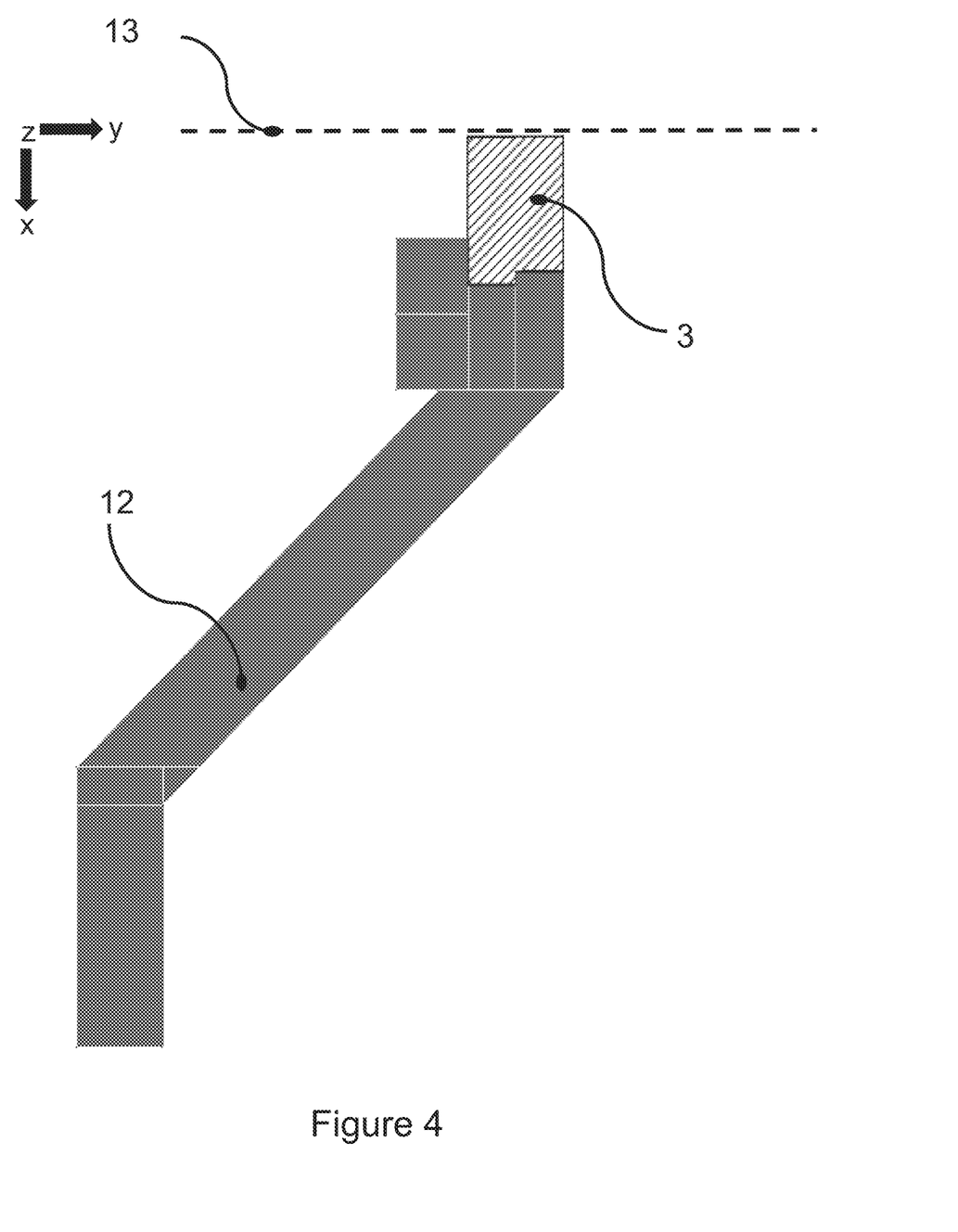
FIG. 4 shows a half section of the electron gun cathode mount from FIG. 3.

FIG. 4 shows a half-section through the electron gun cathode mount (cathode holder) 12 of FIG. 3, where the cathode holder 12 holds the thermionic cathode 3 at its apex. Line 13 represents the line of symmetry and central axis of the conical structure. As discussed with respect to FIG. 3, the planar graphite layers are oriented parallel to the x-z plane.

Figure 5:
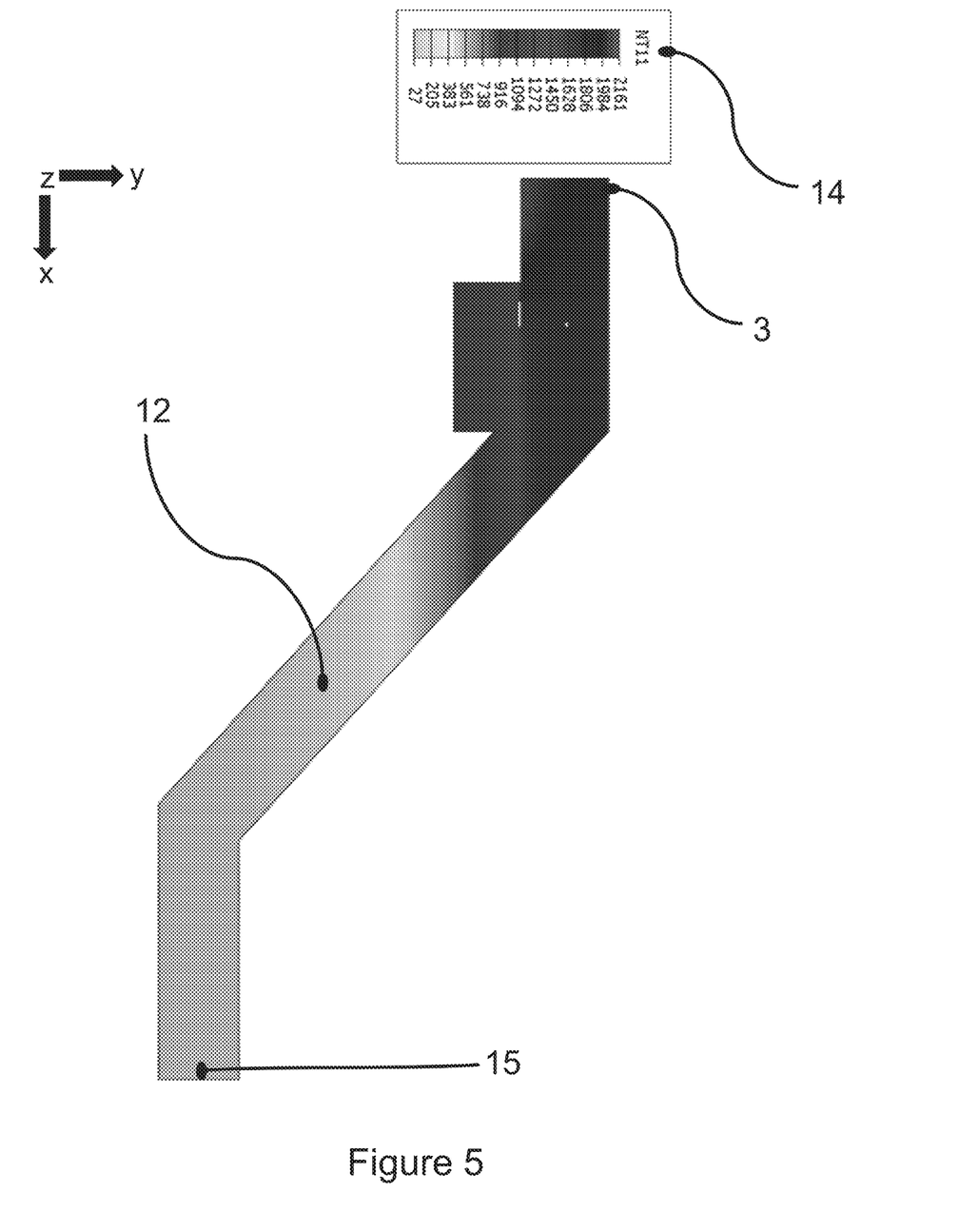
FIG. 5 shows the results of thermal modelling on the electron gun cathode mount half section shown in FIG. 4.

FIG. 5 shows the results of a thermal modelling simulation on the electron gun cathode mount (cathode holder) 12 half section shown in FIG. 4 (axisymmetric model). In the simulation, the thermionic cathode 3 is heated by a laser or by an electron beam (not shown) on the back surface to a temperature of 1727° C. (2000·15K) to emit electrons. Steady-state thermal analysis was carried out to determine the heat input required to achieve the 1727° C. temperature in the thermionic cathode 3. A heat flux of 20950 mW/mm$^2$ was required and, as can be seen when comparing the temperature key 13 (temperatures in ° C.) to the shades overlaid on the half-section, whilst the temperature at the thermionic cathode 3 is roughly 2000° C. (2273·15K), the temperature at the base 15 (laterally outwardly extending flange portion) of the cathode holder 12 is of the order of hundreds of ° C. The shading indicates that there is good thermal distribution along the z-x axis, but poor thermal distribution along the z-y axis, meaning less thermal energy is conducted along the cathode holder 12 to where it contacts the attachment member at the base 15, which, given that the rest of the cathode holder 12 is held in space (i.e. a vacuum during operation of the equipment) then thermal bridging is minimised, meaning less thermal flux is required to be applied by the heat source to maintain the thermionic cathode 3 at the temperature required for the emittance of electrons therefrom.

Figure 6A:
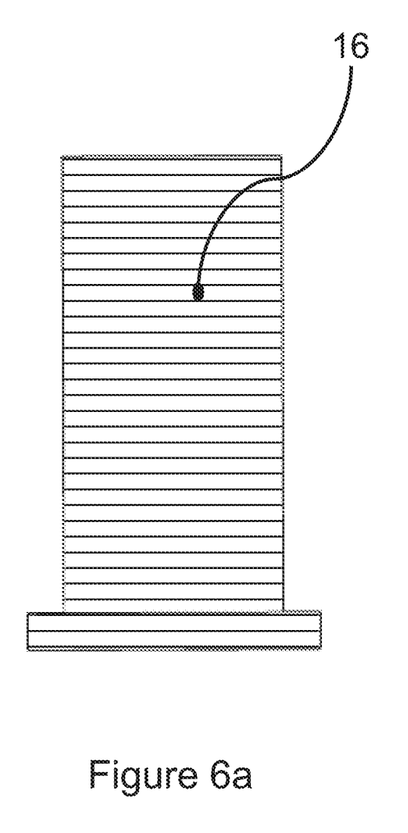
FIGS. 6a and 6b show the orientation of the planar layers of pyrolytic graphite in electron gun cathode mounts according to the first aspect of the present invention having cylindrical and conical structures.
Figure 6B:
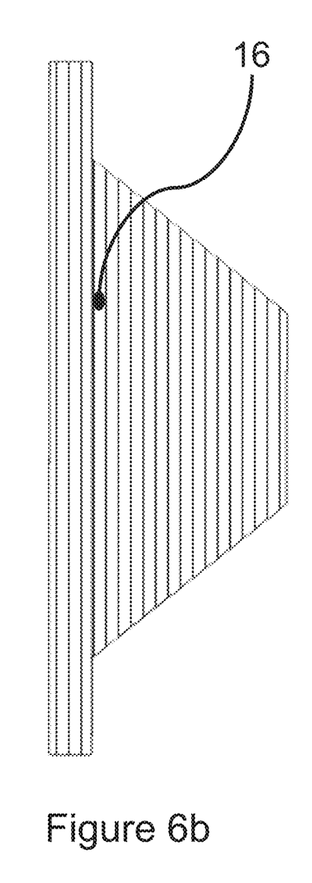

FIGS. 6a and 6b show electron gun cathode mounts (cathode holders) according to the first aspect of the present invention in cylindrical and conical shaped cross-sections, i.e. having cylindrical (6a) and conical (6b) structures, in which a preferential alignment of the planar layers 16 of pyrolytic graphite to control thermal properties can be seen (scale exaggerated for clarity). Although FIG. 6b shows the planar layers 16 running perpendicular to the central axis of the conical structure, the planar layers 16 could in some circumstances be oriented parallel to the central axis of the conical structure (or at selected other angles), dependent upon cone angle/shape. Essentially, the planar layers 16 should be orientated so as to minimise thermal conduction along the electron gun cathode mount. None of the planar layers should extend along the length of the electron gun cathode mount. There should therefore be no direct planar path for heat transfer along the length of the electron gun cathode mount, i.e. there should be no direct planar path for heat transfer along any of the planar layers of the pyrolytic graphite from a thermionic cathode held at the apex of the conical structure (not shown) to the attachment member (not shown). It is noted that the conical structure is advantageous as it generally means that no direct thermal path along the planar layers is presented from the thermionic cathode to the attachment member (locating member) and its interface with the rest of the electron gun assembly.

Figure 7:
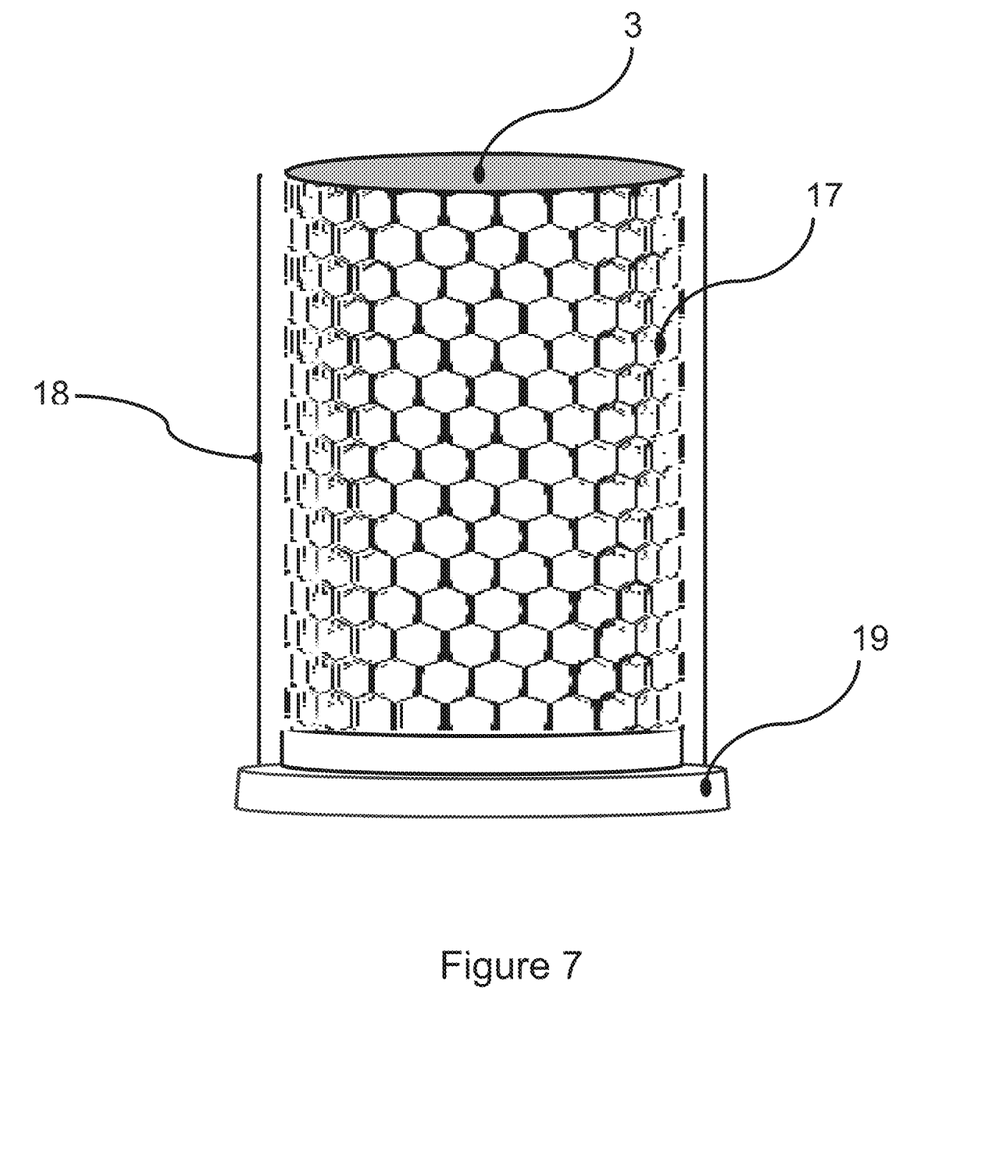
FIG. 7 shows an electron gun cathode mount according to the first aspect of the present invention.

FIG. 7 shows an electron gun cathode mount (cathode holder) 17 according to the first aspect of the invention, fabricated using additive manufacturing (also known as '3D printing') of precursor material followed by pyrolysis. The electron gun cathode mount 17 has a lattice structure formed of pyrolytic graphite and further comprises an outer layer or sleeve 18 that encloses the lattice structure (scale/positioning exaggerated for clarity). The sleeve 18 may either be fabricated from pyrolytic graphite (using additive manufacturing or more traditional construction methods) or an alternative material (e.g. ultra-thin tantalum). A laterally outwardly extending flange portion 19 for mating to an attachment member (not shown) is also shown, as is the thermionic cathode 3.

The invention claimed is:

1. An electron gun cathode mount adapted at one end to secure a thermionic cathode and at the other end to be connected to an attachment member, wherein the electron gun cathode mount is structured so as to be capable of, when in use, reducing heat transfer from the thermionic cathode to the attachment member, and a material forming the electron gun cathode mount has a thermal conductivity of less than 10 Wm$^{-1}$K$^{-1}$ at the operating temperature of the thermionic cathode in a direction from the thermionic cathode to the attachment member.

2. The electron gun cathode mount according to claim 1, wherein part of the end of the electron gun cathode mount adapted to secure the thermionic cathode surrounds the thermionic cathode.

3. The electron gun cathode mount according to claim 1, wherein the electron gun cathode mount has a tubular structure.

4. The electron gun cathode mount according to claim 3, wherein the electron gun cathode mount has a cylindrical or conical structure.

5. The electron gun cathode mount according to claim 3, wherein the tubular structure comprises a wall that is continuous.

6. The electron gun cathode mount according to claim 3, wherein the tubular structure comprises a wall and at least a portion of said wall is non-continuous.

7. The electron gun cathode mount according to claim 1, wherein a length from one end of the electron gun cathode mount to the other is 2 mm or more.

8. The electron gun cathode mount according to claim 1, wherein the material forming the electron gun cathode mount has a thermal conductivity of less than 3 Wm$^{-1}$K$^{-1}$ at the operating temperature of the thermionic cathode in a direction from the thermionic cathode to the attachment member.

9. The electron gun cathode mount according to claim 1, wherein the material forming the electron gun cathode mount has anisotropic thermal conductivity.

10. The electron gun cathode mount according to claim 8, wherein the material forming the electron gun cathode mount is selected from: ceramic materials such as those based upon zirconia, for example yttria-stabilised zirconia, and alumina; carbon-carbon composites; sintered metallic materials; and pyrolytic graphite, preferably the material forming the electron gun cathode mount is pyrolytic graphite.

11. The electron gun cathode mount according to claim 8, wherein the material forming the electron gun cathode mount is pyrolytic graphite comprising planar layers orientated such that none of the planar layers extend along a length from one end of the electron gun cathode mount to the other.

12. The electron gun cathode mount according to claim 4, wherein the electron gun cathode mount has a cylindrical structure and the material forming the electron gun cathode mount is pyrolytic graphite comprising planar layers orientated transverse to a length from one end of the electron gun cathode mount to the other.

13. The electron gun cathode mount according to claim 4, wherein the electron gun cathode mount has a conical structure and the material forming the electron gun cathode mount is pyrolytic graphite comprising planar layers orientated transverse to the central axis of the conical structure.

14. An electron gun assembly comprising an electron gun cathode mount securing a thermionic cathode at one end and connected to an attachment member at the other, wherein the electron gun cathode mount is structured so as to be capable of, when in use, reducing heat transfer from the thermionic cathode to the attachment member, and a material forming the electron gun cathode mount has a thermal conductivity of less than 10 $Wm^{-1}K^{-1}$ at the operating temperature of the thermionic cathode in a direction from the thermionic cathode to the attachment member.

15. The electron gun assembly according to claim 14, wherein the electron gun assembly further comprises an indirect heat source, said indirect heat source being operable to provide thermal energy to the thermionic cathode secured by the electron gun cathode mount other than via heat transfer through the electron gun cathode mount.

16. The electron gun assembly according to claim 15, wherein the heat source is a laser source(s) or a radio frequency (RF) electron beam emitter.

17. The electron gun assembly according to claim 14, wherein the thermionic cathode is formed from cerium hexaboride, tantalum, lanthanum hexaboride, tungsten, molybdenum, and transition metal carbides, preferably lanthanum hexaboride.

18. The electron gun cathode mount according to claim 6 wherein at least a portion of said wall has a lattice structure.

19. The electron gun cathode mount according to claim 4, wherein the electron gun cathode mount has a conical structure and the material forming the electron gun cathode mount is pyrolytic graphite comprising planar layers orientated perpendicular to the central axis of the conical structure.

20. The electron gun cathode mount according to claim 4, wherein the electron gun cathode mount has a cylindrical structure and the material forming the electron gun cathode mount is pyrolytic graphite comprising planar layers orientated perpendicular to a length from one end of the electron gun cathode mount to the other.

21. The electron gun cathode mount according to claim 1, wherein the material forming the electron gun cathode mount has a thermal conductivity of less than 1.5 $Wm^{-1}K^{-1}$ at the operating temperature of the thermionic cathode in a direction from the thermionic cathode to the attachment member.

* * * * *